(12) United States Patent
Kwon et al.

(10) Patent No.: US 12,262,583 B2
(45) Date of Patent: *Mar. 25, 2025

(54) DISPLAY DEVICE AND MANUFACTURING METHOD THEREOF

(71) Applicant: Samsung Display Co., Ltd., Yongin-si (KR)

(72) Inventors: Seung Wook Kwon, Hwaseong-si (KR); Woo Yong Sung, Seoul (KR); Hyoung Sub Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 276 days.

This patent is subject to a terminal disclaimer.

(21) Appl. No.: 17/953,463

(22) Filed: Sep. 27, 2022

(65) Prior Publication Data

US 2023/0013676 A1 Jan. 19, 2023

Related U.S. Application Data

(60) Continuation of application No. 17/019,458, filed on Sep. 14, 2020, now Pat. No. 11,495,773, which is a
(Continued)

(30) Foreign Application Priority Data

Oct. 11, 2018 (KR) .................. 10-2018-0121115

(51) Int. Cl.
*H10K 50/844* (2023.01)
*H10K 71/00* (2023.01)
(Continued)

(52) U.S. Cl.
CPC .......... *H10K 50/844* (2023.02); *H10K 71/00* (2023.02); *H10K 77/111* (2023.02);
(Continued)

(58) Field of Classification Search
CPC ............... H10K 50/844; H10K 59/873; H10K 59/8731; H10K 71/00; H10K 2102/311; H10K 2102/351; H10K 2102/00
See application file for complete search history.

(56) References Cited

U.S. PATENT DOCUMENTS 8,723,824 B2    5/2014  Myers ............... G06F 3/0488
                                                                345/173
9,214,640 B2   12/2015  Lee et al.
(Continued)

FOREIGN PATENT DOCUMENTS

CN  202084578 U   12/2011
CN  104885140 A    9/2015
(Continued)

*Primary Examiner* — Zandra V Smith
*Assistant Examiner* — John M Parker
(74) *Attorney, Agent, or Firm* — CANTOR COLBURN LLP

(57) ABSTRACT

A display device includes a bending area at which the display device is bendable; an organic light emitting element disposed on the substrate; an encapsulation layer covering an upper surface and a side surface of the organic light emitting element; and a bending area protection layer covering the bending area of the substrate. The upper surface of the encapsulation layer includes a nano structure defined by nano sized protrusions and depressions of the upper surface, and along the substrate, and the bending area is disposed separated from the encapsulation layer.

14 Claims, 9 Drawing Sheets

Related U.S. Application Data division of application No. 16/509,614, filed on Jul. 12, 2019, now Pat. No. 10,818,873.

(51) Int. Cl.
*H10K 77/10* (2023.01)
*H10K 102/00* (2023.01)

(52) U.S. Cl.
CPC .... *H10K 2102/00* (2023.02); *H10K 2102/311* (2023.02); *H10K 2102/351* (2023.02)

(56) References Cited

U.S. PATENT DOCUMENTS

| | | | |
|---|---|---|---|
| 9,276,055 B1* | 3/2016 | Son | H10K 59/131 |
| 9,530,831 B2 | 12/2016 | Lee et al. | |
| 9,614,168 B2 | 4/2017 | Zhang et al. | |
| 9,780,157 B2 | 10/2017 | Kwon et al. | |
| 9,798,414 B2* | 10/2017 | Kim | G06F 1/16 |
| 10,153,457 B2 | 12/2018 | Son et al. | |
| 10,177,344 B2 | 1/2019 | Wang et al. | |
| 10,224,498 B2 | 3/2019 | Um et al. | |
| 10,374,194 B2 | 8/2019 | Son et al. | |
| 10,732,674 B2 | 8/2020 | Lee et al. | |
| 10,826,003 B2 | 11/2020 | Um et al. | |
| 11,223,020 B2 | 1/2022 | Zhang et al. | |
| 2012/0307423 A1 | 12/2012 | Bohn | G06F 1/1652 361/679.01 |
| 2014/0042406 A1 | 2/2014 | Degner | H01L 27/3297 257/40 |
| 2014/0131897 A1 | 5/2014 | Yu | H01L 23/5387 257/783 |
| 2014/0217382 A1 | 8/2014 | Kwon | H01L 51/5246 257/40 |
| 2014/0240985 A1 | 8/2014 | Kim | H05K 1/028 362/249.04 |
| 2014/0306941 A1 | 10/2014 | Kim | H04M 1/0268 345/204 |
| 2015/0091434 A1 | 4/2015 | Kim | H01L 51/0097 313/504 |
| 2015/0230331 A1 | 8/2015 | Lee | H05K 1/0259 361/220 |
| 2015/0253487 A1 | 9/2015 | Nichol | G02B 6/006 362/610 |
| 2015/0363030 A1 | 12/2015 | Nam | G06F 1/1652 345/173 |
| 2016/0037608 A1 | 2/2016 | Ikeda | H01L 27/3293 362/235 |
| 2016/0181346 A1 | 6/2016 | Kwon et al. | |
| 2016/0204366 A1 | 7/2016 | Zhang et al. | |
| 2016/0260915 A1* | 9/2016 | Park | H10K 77/111 |
| 2017/0047547 A1* | 2/2017 | Son | H10K 50/8426 |
| 2018/0197935 A1 | 7/2018 | Yuan | H01L 27/3276 |
| 2019/0012029 A1 | 1/2019 | Hong | G06F 3/0412 |
| 2021/0050537 A1 | 2/2021 | Um et al. | |
| 2022/0344603 A1 | 10/2022 | Um et al. | |

FOREIGN PATENT DOCUMENTS

| | | |
|---|---|---|
| CN | 105789255 A | 7/2016 |
| CN | 106449699 A | 2/2017 |
| CN | 106684256 A | 5/2017 |
| CN | 107004697 A | 8/2017 |
| CN | 107887338 A | 4/2018 |
| KR | 1020140085956 A | 7/2014 |
| KR | 20150011908 A | 2/2015 |
| KR | 1020160142763 A | 12/2016 |
| KR | 1020170020674 A | 2/2017 |
| KR | 1020170095809 A | 8/2017 |

* cited by examiner

DISPLAY DEVICE AND MANUFACTURING METHOD THEREOF

This application is a continuation application of U.S. patent application Ser. No. 17/019,458 filed on Sep. 14, 2020, which is a divisional application of U.S. patent application Ser. No. 16/509,614 filed on Jul. 12, 2019 and issued as U.S. Pat. No. 10,818,873 on Oct. 27, 2020, which claims priority to Korean Patent Application No. 10-2018-0121115 filed on Oct. 11, 2018, and all the benefits accruing therefrom under 35 U.S.C. § 119, the entire contents of which are incorporated herein by reference.

BACKGROUND

(a) Field

The present disclosure relates to a display device and a manufacturing method thereof.

(b) Description of the Related Art

Flexible display devices have been developed that use substrates that are lightweight, strong against impact, and easily flexible. Flexible display devices are attracting attention as next generation display devices that can be used for portable devices and wearable devices as well as television ("TV") and computer monitors.

In addition, when using the flexible substrates, an end portion of a display panel in which pads are located can be bent, thereby reducing a dead space and a bezel width.

SUMMARY

Exemplary embodiments of the invention provide a display device and a manufacturing method thereof for reducing or effectively preventing damage to the display device generated in a manufacturing process, simplifying the manufacturing process, and reducing a material cost, thereby improving productivity and yield for the manufactured display device.

A display device according to an exemplary embodiment includes: a substrate including a bending area; an organic light emitting element disposed on the substrate; an encapsulation layer covering an upper surface and a side surface of the organic light emitting element; and a bending area protection layer covering the bending area of the substrate. The upper surface of the encapsulation layer includes a nano structure defined by nano sized protrusions and depressions of the upper surface, and the bending area protection layer is disposed separated from the encapsulation layer along the substrate.

The bending area protection layer may include a cured portion of an ultraviolet ray curable material.

The ultraviolet ray curable material may include at least one among an acrylate-based polymer, polyurethane, and an acrylate-based material including SiO.

The ultraviolet ray curable material may include at least one among an acryl-based resin, a butyl rubber, a vinyl acetate resin, an ethylene vinyl acetate ("EVA") resin, a natural rubber, a nitrile, a siliceous resin, a silicon rubber, and a styrene block polymer.

Adhesiveness of the bending area protection layer may be about 50 grams-force per inch (gf/inch) to about 200 gf/inch.

A maximum thickness of the bending area protection layer may be about 50 micrometers (μm) to about 150 μm.

A supporting member disposed on a rear surface of the substrate may be further included, and the supporting member may define an opening overlapping the bending area.

Along the substrate, the supporting member defining the opening which overlaps the bending area, may overlap the bending area protection layer covering the bending area, by about 100 μm to about 200 μm.

A driving integrated circuit chip may be further included, and along the substrate, the bending area protection layer may be disposed separated from the driving integrated circuit chip.

An upper protection layer removably attachable to the encapsulation layer, a polarization film disposed on the upper surface of the encapsulation layer, and a window panel disposed on the polarization film, may be further included.

Removal of the upper protection layer from the encapsulation layer may dispose an upper surface of the encapsulation layer exposed to outside the encapsulation layer, and form the nano structure.

The nano structure may form one closed line shape extended along edges of the encapsulation layer.

At the bending area of the substrate, an adhesive supporting layer disposed between the substrate and the bending area protection layer may be further included.

The adhesive supporting layer may include at least one among an acryl-based resin, a butyl rubber, a vinyl acetate resin, an ethylene vinyl acetate ("EVA") resin, a natural rubber, a nitrile, a siliceous resin, a silicon rubber, and a styrene block polymer.

The adhesiveness of the adhesive supporting layer may be higher than the adhesiveness of the bending area protection layer.

A manufacturing method of a display device according to an exemplary embodiment includes: providing a substrate including a bending area at which the display device is bendable; providing an encapsulation layer covering each of an upper surface and a side surface of the organic light emitting element, on the substrate; providing both an upper protection layer on the encapsulation layer covering each of the upper surface and the side surface of the organic light emitting element and a bending area protection layer on the bending area of the substrate; and removing the upper protection layer from the encapsulation layer covering each of the upper surface and the side surface of the organic light emitting element. The providing both the upper protection layer and the bending area protection layer includes respectively applying an ultraviolet ray curable material to the encapsulation layer and to the bending area of the substrate and curing the ultraviolet ("UV") ray curable material, to form the upper protection layer and the bending area protection layer spaced apart from each other along the substrate.

The UV ray curable resin may include at least one among an acrylate-based polymer, polyurethane, and an acrylate-based material including SiO.

The providing both the upper protection layer and the bending area protection layer may provide, the upper protection layer having a maximum thickness of about 100 μm to about 150 μm, and the bending area protection layer having a maximum thickness of about 50 μm to about 150 μm.

The providing the upper protection layer may include providing an individual layer of the ultraviolet ray curable material having a thickness of about 10 micrometers to about 20 micrometers and curing the individual layer, multiple times, to provide the upper protection layer having the maximum thickness of about 100 micrometers to about 150 micrometers.

Forming an adhesive supporting layer which is between the substrate and the upper protection layer and with which the substrate is attached to the upper protection layer may be further included.

The adhesive supporting layer may include at least one among an acryl-based resin, a butyl rubber, a vinyl acetate resin, an ethylene vinyl acetate ("EVA") resin, a natural rubber, a nitrile, a siliceous resin, a silicon rubber, and a styrene block polymer.

According to the exemplary embodiments, damage to a display device which may occur during a manufacturing process may be reduced or effectively prevented, the manufacturing process may be simplified and material cost may be reduced, thereby improving productivity yield of the manufactured display device.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
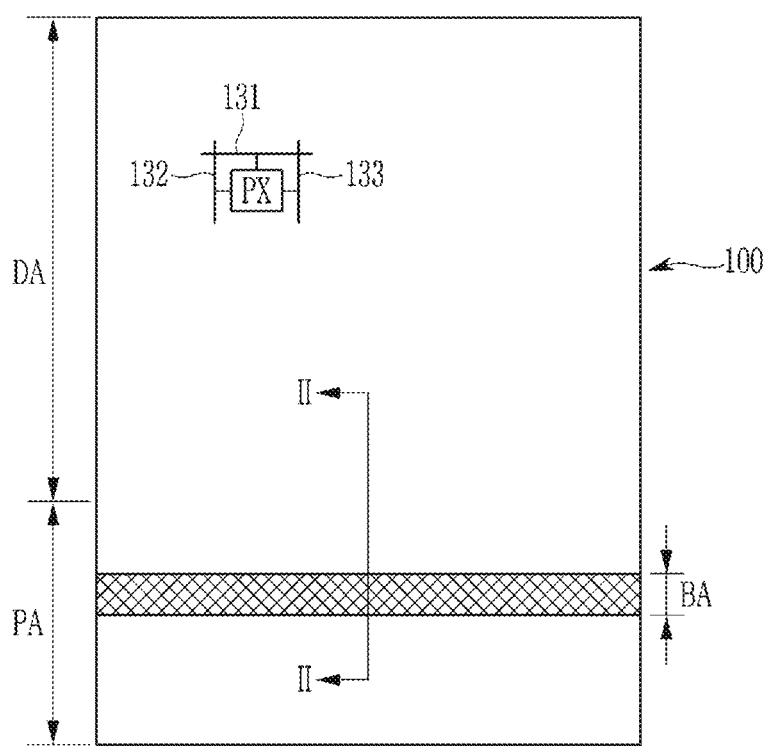
FIG. 1 is a top plan view of an exemplary embodiment of a display device.

The invention will be described more fully hereinafter with reference to the accompanying drawings, in which exemplary embodiments are shown. As those skilled in the art would realize, the described embodiments may be modified in various different ways, all without departing from the spirit or scope of the invention.

In order to clearly explain the invention, portions that are not directly related to the invention are omitted, and the same reference numerals are attached to the same or similar constituent elements through the entire specification.

In addition, the size and thickness of each configuration shown in the drawings are arbitrarily shown for better understanding and ease of description, but the invention is not limited thereto. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present.

Further, in the specification, the word "on" or "above" means positioned on or below the object portion, and does not necessarily mean positioned on the upper side of the object portion based on a gravitational direction. Relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

Further, in this specification, the phrase "on a plane" or "a top plan view" means viewing a target portion from the top, and the phrase "on a cross-section" means viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A display device according to an exemplary embodiment is described with reference to FIG. 1 and FIG. 2.

FIG. 1 is a top plan view of an exemplary embodiment of a display device. FIG. 2 is a cross-sectional view of the display device of FIG. 1 taken along line II-II in FIG. 1.

Referring to FIG. 1, the display device includes a display panel 100. The display device may be an organic light emitting diode display, a liquid crystal display, or an electrophoretic display. An exemplary embodiment in which the display device is the organic light emitting diode display is described below as an example.

The display panel 100 includes a display area DA at which an image is displayed and a non-display area PA at which an image is not displayed. The display area DA includes a pixel PX provided in plurality, the pixel PX being a region where an image is displayed. In the display area DA, a plurality of signal lines including a gate line 131 provided in plurality, a data line 132 provided in plurality, and a driving voltage line 133 provided in plurality are disposed or formed. Each pixel PX includes a pixel circuit connected to a plurality of signal lines, and an organic light emitting element of which light emission is controlled by the pixel circuit. The non-display area PA is a region where elements or wiring for generating and transmitting various signals applied to the display area DA are disposed. The pixel PX may be driven or controlled with the various signals applied to the display area DA via the elements or wiring in the non-display area PA.

The non-display area PA of the display panel 100 includes a bending area BA. The bending area BA is a region where the display panel 100, and consequently the display device, is bendable with respect to a bending axis. Components, elements, wirings, etc. of the display panel 100 may be bendable at the bending area BA. The display panel 100 is bendable at the bending area BA so that the display device which is bent disposes a portion of the non-display area PA at a rear surface of the display panel 100 which is opposite to a front surface thereof at which an image is viewable, thereby reducing a dead space due to the non-display area PA. A dead space may be defined by a portion of the non-display area PA at which signal lines, elements, wiring, etc. are omitted but nevertheless occupy a space within the display device.

Figure 2:
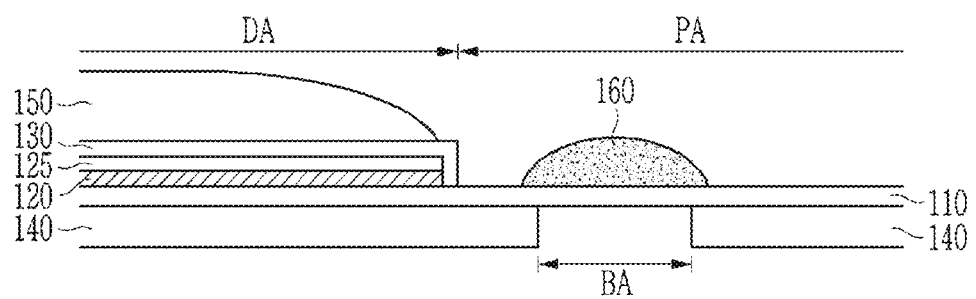
FIG. 2 is a cross-sectional view of the display device of FIG. 1 taken along line II-II in FIG. 1.

Referring to FIG. 2, the display device includes a substrate 110, a thin film transistor array panel 120, an organic light emitting element 125, an encapsulation layer 130, a supporting member 140, an upper protection layer 150, and a bending area protection layer 160.

The display device and components thereof may be disposed in a plane defined by a first direction and a second direction which cross each other. In FIG. 1, the horizontal direction may represent one of the first direction and the second direction, while the vertical direction represents the other one of the first direction and the second direction. The bending axis in the bending area BA may extend along the horizontal direction in FIG. 1. A thickness of the display device and components thereof extends along a third direction which crosses each of the first direction and the second direction. In FIG. 2, the horizontal direction may represent the first direction and/or the second direction, while the vertical direction represents a thickness direction.

The substrate 110 may include a flexible material such as plastic, which may be bent, curved, folded, or rolled. In an exemplary embodiment, for example, the substrate 110 may include polyimide ("PI"), polyethylene naphthalate ("PEN"), polycarbonate ("PC"), polyarylate ("PAR"), polyether imide ("PEI"), polyether sulfone ("PES"), etc. The substrate 110 is divided into the display area DA and the non-display area PA described in FIG. 1, and the non-display area PA includes the bending area BA. The display area DA and the non-display area PA may define an entire planar area of the substrate 110, without being limited thereto.

The thin film transistor array panel 120 is disposed on the substrate 110 in the display area DA thereof. The thin film transistor array panel 120 includes at least one thin film transistor and a plurality of signal lines including a plurality of gate lines, a plurality of data lines, and a plurality of driving voltage lines. The thin film transistor may be respectively disposed in each pixel PX among a plurality of the pixel PX, and connected to a plurality of signal lines at the pixel PX.

The organic light emitting element 125 is disposed on the thin film transistor array panel 120. The organic light emitting element 125 may be disposed in each pixel PX among a plurality of the pixel PX. The organic light emitting element 125 may include a pixel electrode, a common electrode, and an organic emission layer. The thin film transistor and the pixel electrode of the thin film transistor array panel 120 are connected to each other such that the light emission at the pixel PX is controlled. The pixel PX may include a light emission area at which light is emitted from the organic light emitting element 125. Holes and electrons are injected into the organic emission layer from the pixel electrode and the common electrode, and an exciton, of which the hole and electron are combined, is dropped from an excited state to a ground state, thereby realizing the light emission.

According to an exemplary embodiment, a touch sensing layer (not shown) for sensing a touch to the display device and/or the display panel 100 may be further included, and may be disposed above or under the organic light emitting element 125.

The encapsulation layer 130 covering the organic light emitting element 125 is disposed on the organic light emitting element 125. The encapsulation layer 130 covers side surface as well as an upper surface of the organic light emitting element 125, thereby encapsulating the organic light emitting element 125 on the substrate 110. Since the organic light emitting element 125 is susceptible to moisture and oxygen, the encapsulation layer 130 seals the organic light emitting element 125 to block the inflow of external moisture and oxygen from outside the encapsulation layer 130.

The encapsulation layer 130 may include a plurality of layers, and may be formed or include of a composite layer including both an inorganic layer and an organic layer. The encapsulation layer 130 may be formed or include of a triple layer in which an inorganic layer, an organic layer, and an inorganic layer are sequentially provided or formed. Here, the inorganic layer may include at least one among a metal oxide, a metal oxynitride, a silicon oxide, a silicon nitride, and a silicon oxynitride. The organic layer may include or be formed of polymer series materials, without being limited thereto.

The supporting member 140 is disposed under the substrate 110, on a rear surface of the substrate 110 opposite to the front surface on which the thin film transistor array panel 120, the organic light emitting element 125 and the encapsulation layer 130 are disposed. The supporting member 140 may have a function of protecting and supporting the substrate 110. The supporting member 140 may define or include an opening therein overlapping the bending area BA. Accordingly, the display panel may be easily bent in the bending area BA since the supporting member 140 is not disposed in the bending area BA.

The upper protection layer 150 is disposed on the encapsulation layer 130. In an exemplary embodiment of manufacturing a display device, the upper protection layer 150 may be provided or formed by spraying an ultraviolet ("UV")-curable resin such as by an inkjet printing method, and curing the UV-curable resin with ultraviolet rays (e.g., an ultraviolet ray curable resin).

The UV-curable resin may include an ultraviolet ray curable material. The ultraviolet ray curable material as a material that may be cured with ultraviolet rays may include at least one among an acrylate-based polymer (e.g., a polymer including acrylate), polyurethane, and an acrylate-based material including SiO (e.g., an acrylate material including SiO), without being limited thereto. The ultraviolet ray curable material may include any of a number of materials that may be cured with ultraviolet rays. The UV-curable resin may further include a photoinitiator, a heat stabilizer, an antioxidant, an antistatic agent, and/or a slip agent.

The upper protection layer 150 may include a cured portion of the above-described ultraviolet ray curable material. That is, the upper protection layer 150 may include at least one cured portion among the acrylate-based polymer, polyurethane, and the acrylate-based material including SiO. Also, the upper protection layer 150 may further include the photoinitiator, the heat stabilizer, the antioxidant, the antistatic agent, or the slip agent remaining in the upper protection layer 150 after the UV-curable resin for forming the upper protection layer 150 is cured.

The upper protection layer 150 as a cured portion of a material layer, according to an exemplary embodiment, may include at least one among an acryl-based resin (e.g., a resin including an acryl material), a butyl rubber, a vinyl acetate resin, an ethylene vinyl acetate ("EVA") resin, a natural rubber, a nitrile, a siliceous resin, a silicon rubber, and a styrene block polymer. As further including at least one of these materials, the upper protection layer 150 may have predetermined adhesiveness with respect to the encapsulation layer 130. The adhesiveness of the upper protection layer 150 with respect to the encapsulation layer 130 may be about 3 grams-force per inch (gf/inch) to about 10 gf/inch.

The upper protection layer 150 is removably disposed on the encapsulation layer 130. In an exemplary embodiment, the upper protection layer 150 is disposed on the encapsulation layer 130 to protect the encapsulation layer 130 such as during a manufacturing process, and is subsequently removed. The upper protection layer 150 may be disposed along an entirety of the encapsulation layer 130 in the display area DA, without being limited thereto. The upper protection layer 150 may be selectively disposed in some regions on the encapsulation layer 130 in the display area DA, and/or may have different thicknesses per region of the encapsulation layer 130 in the display area DA.

A maximum thickness of the upper protection layer 150 may be about 100 micrometers ($\mu$m) to about 150 $\mu$m. The thickness of the upper protection layer 150 is a height in a vertical direction or thickness direction with respect to an upper surface of the substrate 110. The thickness of the upper protection layer 150 may gradually decrease as a distance to an end of the upper protection layer 150 decreases. In cross-section, the upper surface of the upper protection layer 150 may have an inclined shape that is curved at the end, and the inclination of the upper surface of the upper protection layer 150 with respect to the substrate 110 may increase as a distance to the end of the upper protection layer 150 decreases.

The bending area protection layer 160 is disposed on the substrate 110 in the bending area BA thereof, and is spaced apart from the upper protection layer 150 and the encapsulation layer 130 along the substrate 110, without being in contact with the upper protection layer 150 and the encapsulation layer 130. The bending area protection layer 160 covers the bending area BA and relaxes a stress force applied to wiring (not shown) disposed in the bending area BA of the substrate 110 during the bending of the display device, thereby reducing or effectively preventing cracks in the wiring especially portions thereof disposed in the bending area BA.

In an exemplary embodiment of manufacturing a display device, the bending area protection layer 160 may be provided or formed by injecting the UV-curable resin such as by the inkjet printing method and curing the UV-curable resin with ultraviolet rays. The UV-curable resin may include the ultraviolet ray curable material. The ultraviolet ray curable material means a material that may be cured with ultraviolet rays, and the detailed contents are as described in the description of the upper protection layer 150.

The bending area protection layer 160 may include the cured portion of an ultraviolet ray curable material as described in the description of the upper protection layer 150, and thus a detailed description thereof is omitted here. The bending area protection layer 160 may include a same material as the upper protection layer 150. The bending area protection layer 160 and the upper protection layer 150 may respectively be portions of a same material layer among layers disposed on the substrate 110. However, according to the exemplary embodiment, bending area protection layer 160 and the upper protection layer 150 may be provided or formed to include different materials and/or respectively be portions of different material layers among layers disposed on the substrate 110.

The bending area protection layer 160 may further include the photoinitiator, the heat stabilizer, the antioxidant, the antistatic agent, or the slip agent remaining in the bending area protection layer 160 after the UV-curable resin for forming the bending area protection layer 160 is cured.

Also, the bending area protection layer 160 may further include at least one among the acryl-based resin, the butyl rubber, the vinyl acetate resin, the ethylene vinyl acetate ("EVA") resin, the natural rubber, the nitrile, the siliceous resin, the silicon rubber, and the styrene block polymer according to an exemplary embodiment. As these materials are included, the bending area protection layer 160 may have the predetermined adhesiveness. The adhesiveness of the bending area protection layer 160 with respect to an underlying layer in contact therewith such as the substrate 110, may be higher than the adhesiveness of the upper protection layer 150 with respect to an underlying layer such as the encapsulation layer 130. In an exemplary embodiment, for example, the adhesiveness of the bending area protection layer 160 may be about 50 gf/inch to about 200 gf/inch.

A maximum thickness of the bending area protection layer 160 may be from about 50 μm to about 150 μm. The thickness of the bending area protection layer 160 is the height in the vertical direction with respect to the upper surface of the substrate 110.

The bending area protection layer 160 may overlap a portion of the supporting member 140 in the display area DA and a portion of the supporting member 140 in the non-display area PA which is located beyond the bending area BA in a direction towards an end of the display device (e.g., furthest to the right in FIG. 2).

A width of an overlapping region at which the bending area protection layer 160 and the supporting member 140 overlap each other may be about 100 μm to about 200 μm. The width of the overlapping region is a distance taken in a normal direction to the bending axis, at which the bending area protection layer 160 and the supporting member 140 overlap each other. Referring to FIG. 2, the width is taken along the horizontal direction, which is normal to the bending axis located in the bending area BA. That is, the bending area protection layer 160 may be extended and disposed to a region that is 100 μm to 200 μm away from the bending area BA, at each of opposing sides thereof. As such, as the portion of the bending area protection layer 160 overlaps the supporting member 140, the cracking of the wiring disposed in the bending area BA may be reduced or effectively prevented.

Figure 3:
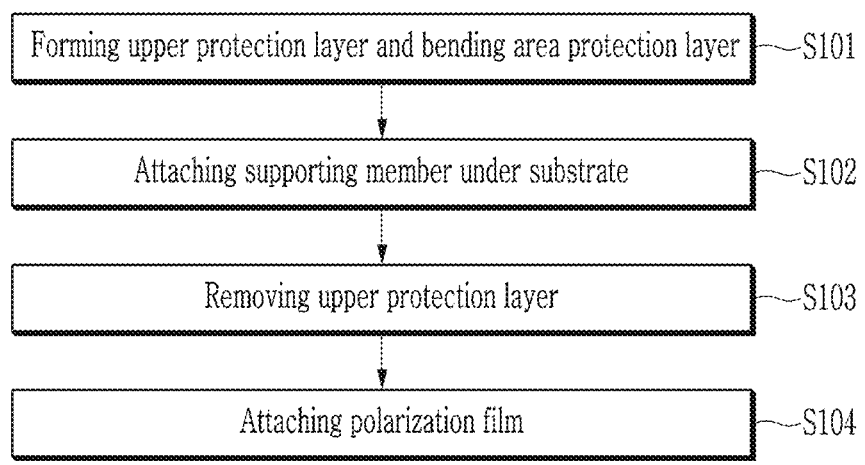
FIG. 3 is a flowchart showing an exemplary embodiment of a manufacturing method of a display device.
Figure 4:
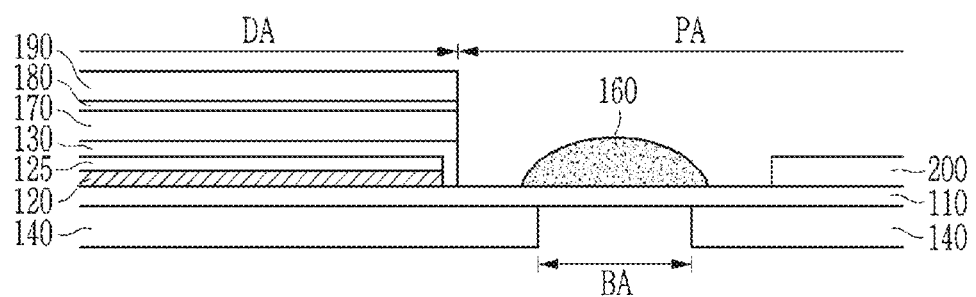
FIG. 4 is a cross-sectional view of an exemplary embodiment of a display device which is unbent, provided according to the manufacturing method of FIG. 3.
Figure 5:
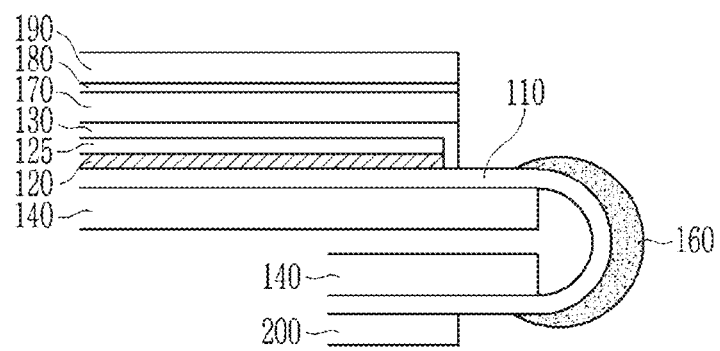
FIG. 5 is a cross-sectional view showing the display device of FIG. 4 which is bent.

An exemplary embodiment of manufacturing method of the display device is described with reference to FIG. 3 to FIG. 5. FIG. 3 is a flowchart showing an exemplary embodiment of a manufacturing method of a display device, and FIG. 4 is a cross-sectional view of an exemplary embodiment of a display device provided according to the manufacturing method of FIG. 3. FIG. 5 is a cross-sectional view showing the display device of FIG. 4, which is bent The substrate 110 is provided or formed on a base substrate or carrier substrate (not shown), such as to be attached thereto. The base substrate and the substrate 110 may be removably attachable to each other. On the substrate 110, the thin film transistor array panel 120 and the organic light emitting element 125 are provided or formed in the display area DA of the substrate 110, to each be encapsulated by the encapsulation layer 130 in the display area DA of the substrate 110. A conductive wiring (not shown) is provided or formed in the non-display area PA of the substrate 110. The base substrate attached to the substrate 110 is to ensure a favorable overall thickness and rigidity for handling the substrate 110 and layers provided thereon during manufacturing of the display device. The base substrate may be a flexible substrate.

As shown in FIG. 3, the upper protection layer 150 and the bending area protection layer 160 (FIG. 2) are respectively provided or formed by the inkjet printing method, in the bending area BA and on the encapsulation layer 130 in the display area DA, on the substrate 110, (S101).

For forming the upper protection layer 150 and the bending area protection layer 160, the UV-curable resin may be sprayed at a predetermined volume through a nozzle of an inkjet printing apparatus at a predetermined position along the substrate 110 (e.g., at the display area DA and at the non-display area PA), and cured with ultraviolet ("UV") rays.

In a conventional flexible organic light emitting device, an encapsulation layer is provided or formed to encapsulate a display substrate to reduce or effectively prevent penetration of moisture and oxygen to the organic material as a light emitting material. However, the encapsulation layer of the conventional flexible organic light emitting device is relatively easily damaged by external scratches, or stampings or scratches due to foreign materials generated during subsequent manufacturing processes, and these stampings or scratches cause defects such as dark spots, etc. of the conventional flexible organic light emitting device.

To solve these problems, for the substrate of the conventional flexible organic light emitting device, an upper protection film including or formed of a polyethylene terephthalate ("PET") film is attached to the encapsulation layer so as to protect the encapsulation layer during the subsequent manufacturing processes. However, the process of attaching the upper protection film is additionally used to manufacture the conventional flexible organic light emitting device, which reduces productivity and yield for the manufactured conventional flexible organic light emitting device. Furthermore, selective coating is not possible for individual portions of the upper protection layer, since the upper protection layer may only be provided or formed on an entirety of the surface of the substrate having the encapsulation layer thereon.

However, according to one or more exemplary embodiment, the upper protection layer 150 and the bending area protection layer 160 may be provided or formed simultaneously, thereby simplifying the process. As being provided or formed simultaneously, the upper protection layer 150 and the bending area protection layer 160 may be provided in or formed from as same process and/or using a same material layer, such that the upper protection layer 150 and the bending area protection layer 160 of the display device are respectively portions of the same material layer. Also, since the upper protection layer 150 may be locally provided or formed only in some regions by the inkjet printing method, as opposed to be provided at an entirety of a substrate of the conventional display panel, a material cost may be reduced. That is, the upper protection layer 150 may be provided or formed only at the region where the encapsulation layer 130 of the display panel is disposed, instead of providing or forming the upper protection layer 150 on an entirety of the substrate of the conventional display panel.

The spraying and curing process of the UV-curable resin for providing or forming the upper protection layer 150 on the encapsulation layer 130 may be repeatedly performed several times. Specifically, an individual process of injecting the UV-curable resin onto the substrate 110 at the region where the upper protection layer 150 is to be provided or formed, with a thickness of about 10 μm to about 20 μm and curing the injected UV-curable resin from the individual process with ultraviolet rays, is repeated several times to increase the thickness of the cured UV-resin to provide or form the upper protection layer 150 at a total thickness of about 100 μm to about 150 μm. That is, in an exemplary embodiment, an individual layer of the UV-curable resin having a thickness of about 10 μm to about 20 μm is provided and cured, multiple times, to provide the upper protection layer 150 having the maximum thickness of about 100 μm to about 150 μm. If a relatively large amount of UV-curable resin is cured at one time, the curing time increases and all portions of the UV-curable resin may not be uniformly cured. However, in an exemplary embodiment the UV-curable resin sprayed in an individual process at the thickness of about 100 μm to about 150 μm may be cured at one time in one individual process.

For providing or forming the bending area protection layer 160 in the bending area BA, the UV-curable resin may be injected and cured to be provided or formed with the thickness of about 50 μm to about 150 μm along a region disposed in the bending area BA and which extends from the bending area BA by about 100 μm to about 200 μm. That is, a total width of the bending area protection layer 160 may include a width of the bending area BA in addition to both distances which are each extended from opposing sides of the bending area BA by about 100 μm to about 200 μm. As such, the bending area protection layer 160 which extends from the bending area BA and toward the display area DA, is provided or formed to not overlap the encapsulation layer 130 and the upper protection layer 150.

As described above, the UV-curable resin may contain the ultraviolet ray curable material, and the detailed description is the same as described in FIG. 2 such that repeated description is omitted here.

The base substrate is removed from the substrate 110 having the upper protection layer 150 and the bending area protection layer 160 on the thin film transistor array panel 120 and the organic light emitting element 125 which are encapsulated by the encapsulation layer 130 thereon, and the supporting member 140 is attached under the substrate 110 having the base substrate removed therefrom (S102). The supporting member 140 may serve to support and protect the substrate 110, especially as having the various layers provided or formed thereon. The supporting member 140 may form an outermost layer of the display device, without being limited thereto.

Portions of the supporting member 140 may be spaced apart from each other to define the opening in the supporting member 140 which overlaps the bending area BA. A width of each portion of the supporting member 140 which overlaps the bending area protection layer 160 may be about 100 μm to about 200 μm along the substrate 110 in a direction normal to the bending axis.

After attaching the supporting member 140, a driving integrated circuit chip 200 may be provided or formed on an end portion of the substrate 110 in the non-display area PA thereof. Along the substrate 110, the driving integrated circuit chip 200 on the end portion of the substrate 110 may be disposed to be spaced apart from the bending area protection layer 160 covering the bending area BA without being in contact therewith. The driving integrated circuit chip 200 may control the display device and output signals for driving the display panel 100 of the display device. The driving integrated circuit chip 200 may be an integral driving integrated circuit chip that applies a timing signal to apply a data voltage to a pixel PX, a gate voltage to a pixel PX, or the like, without being limited thereto.

The upper protection layer 150 is removed from the substrate 110, and is particularly removed from the encapsulation layer 130 on the substrate 110 (S103). The removing of the upper protection layer 150 exposes the encapsulation layer 130 on the substrate 110. The upper protection layer 150 may be removed by a physical method such as including attached an adhesive member (e.g., tape) to one end and peeling the adhesive member and the upper protection layer 150 attached thereto by external force, but is not limited thereto. Since the bending area protection layer 160 is provided or formed to not be in contact with the upper protection layer 150 and the encapsulation layer 130, only the upper protection layer 150 may be removed without removing the bending area protection layer 160. That is, the bending area protection layer 160 may remain on the substrate 110 having the various layers provided or formed thereon, after the upper protection layer 150 is removed.

The adhesiveness of the upper protection layer 150 with respect to the encapsulation layer 130 may be lower than the adhesiveness of the bending area protection layer 160 with respect to the substrate 110. In an exemplary embodiment, for example, the adhesiveness of the upper protection layer 150 with respect to an underlying layer in contact therewith may be about 3 gf/inch to about 10 gf/inch, and the adhesiveness of the bending area protection layer 160 with respect to an underlying layer in contact therewith may be about 50 gf/inch to about 200 gf/inch.

Since the upper protection layer 150 is removably attachable to the encapsulation layer 130, such that the upper protection layer 150 is attachable during some processes of manufacturing and removable subsequent to the processes, upper and lower limits of the adhesiveness are defined. If the adhesiveness of the upper protection layer 150 with respect to an underlying layer in contact therewith such as the encapsulation layer 130 is less than 3 gf/inch, there may be a phenomenon in that the upper protection layer 150 is prematurely peeled off or the outer portion falls off during the process. In contrast, if the adhesiveness of the upper protection layer 150 with respect to an underlying layer in contact therewith such as the encapsulation layer 130 exceeds 10 gf/inch, the encapsulation layer 130 is damaged when the upper protection layer 150 is removed.

Unlike the upper protection layer 150, which is removed after some processes of manufacturing, the bending area protection layer 160 which is removably attachable to an underlying layer in contact therewith such as the substrate 110 is not removed and remains on the substrate 110 to relieve the stress applied to the substrate 110 during bending of the display panel 100 and/or the display device. Therefore, if the adhesiveness described above of the bending area protection layer 160 is less than about 50 gf/inch, the bending area protection layer 160 may be torn and damaged.

After the upper protection layer 150 is removed, a polarization film 170, an adhesive layer 180, and a window panel 190 are sequentially provided or formed on the substrate 110 having the various layers thereon (S104).

The polarization film 170 may reduce the reflection of external light incident from outside the display device. When the external light passes through the polarization film 170 and is reflected by the thin film transistor array panel 120 and then passes through the polarization film 170 again, the phase of the external light may be changed. As a result, extinction interference occurs between the phase of the reflected light and the external light incident to the polarization film 170, so that the light recognizable from outside the display device may be suppressed and the display quality of the display device may be improved. Also, as a retarder (not shown) is further included, the reflection of external light is suppressed by reducing or effectively preventing external light passing through the retarder and the polarization film 170 from being reflected by the thin film transistor array panel 120 and returned through the polarization film 170. However, the invention is not limited, and the polarization film 170 may include any conventional configuration capable of reducing external light reflection.

The adhesive layer 180 may include an optically clear adhesive ("OCA"), an optically clear resin ("OCR"), and/or a pressure sensitive adhesive ("PSA").

The window panel 190 serves to protect the display panel 100 and/or the display device from an environment outside thereof. The window panel 190 may form an outermost layer of the display panel 100 and/or the display device. The image output from the display panel 100 may be transmitted to the user through the window panel 190. The window panel 190 may include or be formed of a light transmissive material, such as glass, polyethylene terephthalate, and acryl, but is not limited thereto. Thus, the display device shown in FIG. 4 is manufactured.

FIG. 4 is the cross-sectional view of the display device provided or formed according to the manufacturing method of FIG. 3. In FIG. 4, the display device including the substrate 110 having the various layers thereon, is flat. The display device which is flat, disposes the non-display area PA adjacent to the display area DA along the substrate 110, and disposes the substrate 110 and the elements or wiring in the bending area BA of the substrate 110 flat.

The display device of FIG. 4 is similar to the display device of FIG. 2 except for including the polarization film 170, the adhesive layer 180, the window panel 190, and a driving integrated circuit chip 200 and excluding the upper protection layer 150, such that the detailed description of the overlapped contents is omitted.

The display device of FIG. 4 does not include the upper protection layer 150 shown in FIG. 2, by the manufacturing process of removing the upper protection layer 150 of FIG. 3 (S103) and subsequently attaching the polarization film 170, the adhesive layer 180, and the window panel 190 on the encapsulation layer 130 (S104). The removal of the upper protection layer 150 from the encapsulation layer 130 (S103) disposes an upper surface of the encapsulation layer 130 exposed to outside the encapsulation layer 130. The attaching of the polarization film 170 disposes the polarization film 170 on the upper surface of the encapsulation layer 130 which is exposed to outside thereof by the removal of the upper protection layer 150.

Along the substrate 110, the driving integrated circuit chip 200 is disposed to be spaced apart from the bending area protection layer 160 in the non-display area PA of the substrate 110. The display device of FIG. 4 may further include a printed circuit board ("PCB") (not shown) attached to the display panel 100. The printed circuit board ("PCB") may be attached to the display panel 100 through the driving integrated circuit chip 200, without being limited thereto. The printed circuit board ("PCB") may provide control signals or driving signals with which the display panel (e.g., the pixel PX) is controlled and/or image signals or data signals including information for the image to be displayed by the pixel PX, to the driving integrated circuit chip 200 from outside thereof.

The details of the polarization film 170, the adhesive layer 180, the window panel 190, and the driving integrated circuit chip 200 are the same as those described with respect to FIG. 3 and are omitted here. According to an exemplary embodiment, another adhesive layer may be included between the encapsulation layer 130 and the polarization film 170, without being limited thereto.

Referring to FIG. 5, the display panel of FIG. 4 is bent at the bending area BA. The display panel 100 which is bent disposes the driving integrated circuit chip 200 to overlap the display area DA of the display panel 100. When the display panel 100 is bent, the wiring disposed in the bending area BA may be stressed, but the bending area protection layer 160 covering the bending area BA and the wiring disposed therein receives a stress (e.g., tensile stress) when bending such that the stress applied to the wiring may be reduced.

Figure 6:
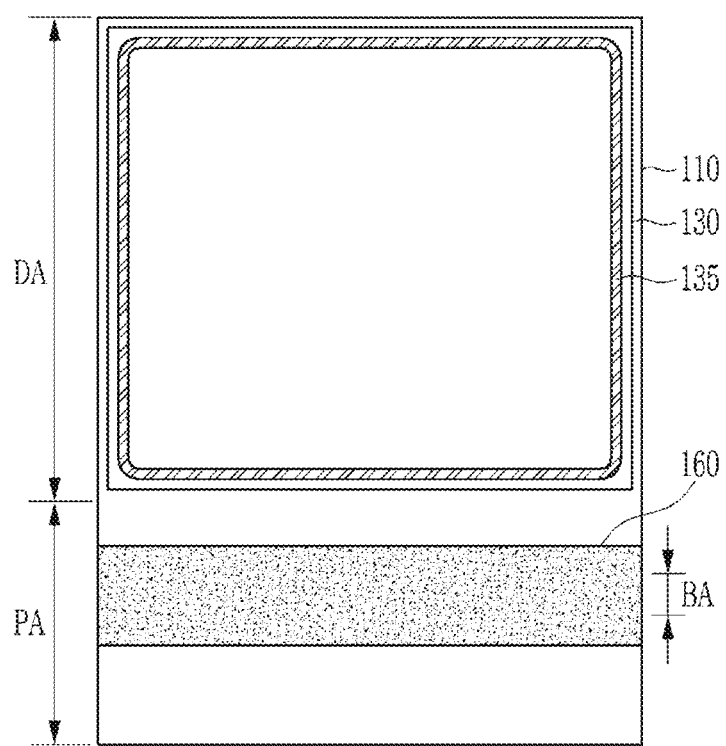
FIG. 6 is a top plan view showing an exemplary embodiment of an upper surface of an encapsulation layer of a display device.

FIG. 6 is a top plan view showing an exemplary embodiment of an upper surface of an encapsulation layer of a display device. Specifically, FIG. 6 represents the upper surface of the encapsulation layer 130 after the upper protection layer 150 (FIG. 2) is removed. Therefore, the bending area protection layer 160 is disposed in the bending area BA, but the upper protection layer 150 is removed and is not present.

As described above, the upper protection layer 150 and the bending area protection layer 160 of the display device according to one or more exemplary embodiment are each formed by a process of injecting the UV-curable resin by the inkjet printing method and curing the injected UV-curable resin with ultraviolet rays. When the upper protection layer 150 is provided or formed by the inkjet printing method on the encapsulation layer 130, a nano structure 135 including nano sized protrusions and depressions is formed at an edge region where an end of the upper protection layer 150 is disposed overlapping the encapsulation layer 130. In an exemplary embodiment, the nano structure 135 may be portions of the encapsulation layer 130 which have been deformed due to removal of the upper protection layer 150. In an exemplary embodiment, removal of the upper protection layer 150 from the upper surface of the encapsulation layer 130 forms the nano structure 135 defined by nano sized protrusions and depressions of the upper surface. As the nano structure 135 includes a protrusions and depressions of a nano-unit, an afterimage of a bright-banded shape may be seen compared with other regions.

According to an exemplary embodiment, the upper protection layer 150 may be selectively provided or formed along the substrate 110 (e.g., only on the encapsulation layer 130) and removed from the encapsulation layer 130 of each display panel 100, instead of forming the upper protection layer 150 on an entirety of the substrate 110. Where the upper protection layer 150 is selectively provided or formed along the substrate 110 (e.g., only on the encapsulation layer 130) and removed from the encapsulation layer 130 of each display panel 100, the nano structure 135 may be disposed in a closed line shape respectively extending along lengths of edges of the encapsulation layer 130 in the top plan view.

Another exemplary embodiment of a display device is described with reference to FIG. 7.

Figure 7:
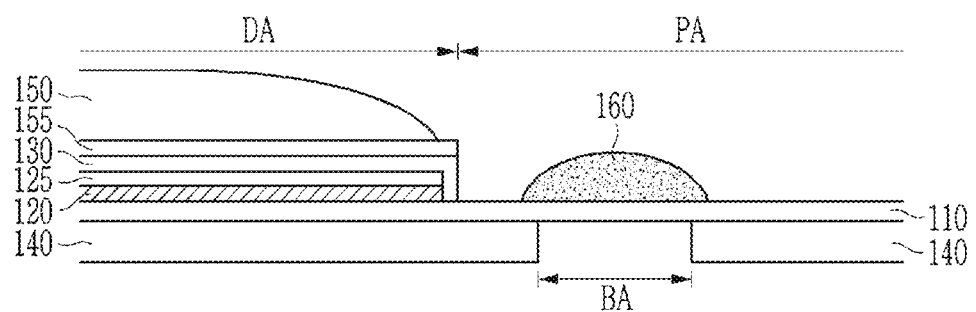
FIG. 7 and FIG. 8 are cross-sectional views of modified exemplary embodiments of a display device.

FIG. 7 is a cross-sectional view of another exemplary embodiment of a display device. The display device of FIG. 7 is similar to the exemplary embodiment of FIG. 2 except for further including a first adhesive supporting layer 155 such that the detailed description of the same constituent elements is omitted, and differences are explained.

The display device according to the exemplary embodiment of FIG. 7 further includes the first adhesive supporting layer 155 between the encapsulation layer 130 and the upper protection layer 150. The adhesiveness of the first adhesive supporting layer 155 with respect to an underlying layer in contact therewith such as the encapsulation layer 130 may be lower than the adhesiveness of the bending area protection layer 160 with respect to an underlying layer such as the substrate 110. In an exemplary embodiment, for example, the adhesiveness of the first adhesive supporting layer 155 may be about 3 gf/inch to about 10 gf/inch.

The first adhesive supporting layer 155 may include at least one among the acryl-based resin, the butyl rubber, the vinyl acetate resin, the ethylene vinyl acetate ("EVA") resin, the natural rubber, the nitrile, the siliceous resin, the silicon rubber, and the styrene block polymer according to an exemplary embodiment.

If the first adhesive supporting layer 155 is further included, proper adhesiveness of the first adhesive supporting layer 155 with the encapsulation layer 130 may be maintained regardless of the adhesiveness of the upper protection layer 150 with respect to an underlying layer in contact therewith. That is, even if the adhesiveness of the upper protection layer 150 is not sufficiently low to facilitate removal thereof from the underlying layer in contact therewith such as the encapsulation layer 130, the upper protection layer 150 may be removed from the encapsulation layer 130 together with the first adhesive supporting layer 155 without damaging the encapsulation layer 130.

Figure 8:
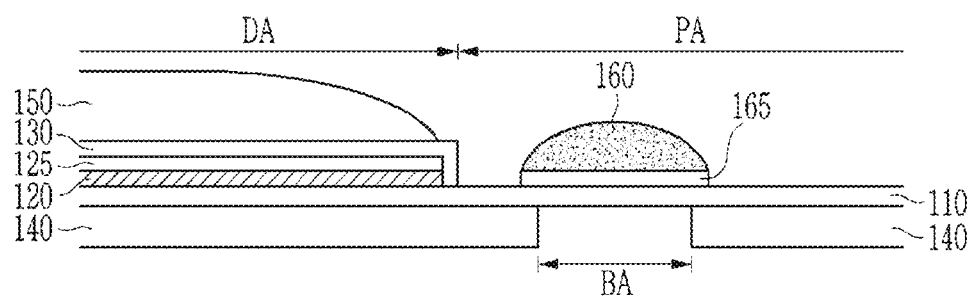

Another exemplary embodiment of a display device is described with reference to FIG. 8. FIG. 8 is a cross-sectional view of still another exemplary embodiment of a display device. Since the display device of FIG. 8 is similar to the exemplary embodiment of FIG. 2 except for including a second adhesive supporting layer 165, the detailed description of the same constituent elements is omitted, and differences are explained.

The display device according to the exemplary embodiment of FIG. 8 further includes a second adhesive supporting layer 165 between the substrate 110 and the bending area protection layer 160. The adhesiveness of the second adhesive supporting layer 165 with respect to an underlying layer in contact therewith in contact therewith such as the substrate 110 may be greater than the adhesiveness of the upper protection layer 150 with respect to an underlying layer in contact therewith such as the encapsulation layer 130. In an exemplary embodiment, for example, the adhesiveness of the second adhesive supporting layer 165 may be about 50 gf/inch to about 200 gf/inch.

The second adhesive supporting layer 165 may further include at least among of the acryl-based resin, the butyl rubber, the vinyl acetate resin, the ethylene vinyl acetate ("EVA") resin, the natural rubber, the nitrile, the siliceous resin, the silicon rubber, and the styrene block polymer according to an exemplary embodiment.

If the second adhesive supporting layer 165 is further included, even if the adhesiveness of the bending area protection layer 160 is not high enough to remain attached to substrate 110, the second adhesive supporting layer 165 may maintain the attached state of the bending area protection layer 160 on the substrate 110 without removal or peeling of the bending area protection layer 160 from the substrate 110.

Figure 9:
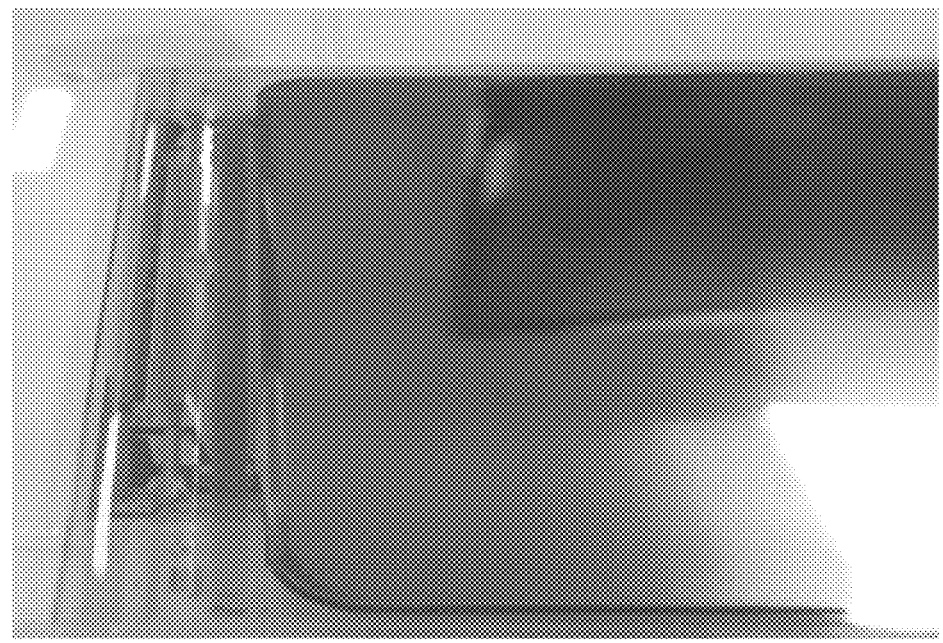
FIG. 9 is an image of an exemplary embodiment of an upper protection layer on an encapsulation layer of a display device.

An example of the formation of the upper protection layer 150 on the encapsulation layer 130 according to an exemplary embodiment will now be described. FIG. 9 is an image of an exemplary embodiment of an upper protection layer 150 removably disposed on an encapsulation layer 130 of a display device.

As shown in FIG. 9 the upper protection layer 150 may be provided or formed on the encapsulation layer 130 to have a total thickness of about 100 μm to about 150 μm by performing an individual process of spraying and curing a layer of UV-curable resin applied by the inkjet printing method on the encapsulation layer 130, several times.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate including a bending area at which the display device is bendable;
   an organic light emitting element disposed on the substrate; and
   an encapsulation layer covering an upper surface and a side surface of the organic light emitting element,
   wherein at least a portion of an upper surface of the encapsulation layer includes a nano structure defined by nano sized protrusions and depressions of the upper surface.

2. The display device of claim 1, wherein in a top plan view, the nano structure forms a closed line shape extended along edges of the encapsulation layer.

3. The display device of claim 2, further comprising:
   a bending area protection layer covering the bending area of the substrate,
   wherein along the substrate, the bending area protection layer is disposed separated from the encapsulation layer, and
   wherein the bending area protection layer includes a cured portion of an ultraviolet ray curable material.

4. The display device of claim 3, wherein the ultraviolet ray curable material includes at least one among a polymer including acrylate, polyurethane, and an acrylate material including SiO.

5. The display device of claim 4, wherein the ultraviolet ray curable material includes at least one among a resin including an acryl-material, a butyl rubber, a vinyl acetate resin, an ethylene vinyl acetate resin, a natural rubber, a nitrile, a siliceous resin, a silicon rubber, and a styrene block polymer.

6. The display device of claim 5, wherein adhesiveness of the bending area protection layer is about 50 grams-force per inch to about 200 grams-force per inch.

7. The display device of claim 6, wherein a maximum thickness of the bending area protection layer is about 50 micrometers to about 150 micrometers.

8. The display device of claim 7, further comprising a supporting member disposed on a rear surface of the substrate,
   wherein
   the organic light emitting element and the encapsulation layer are disposed on a front surface of the substrate which is opposite to the rear surface thereof, and
   the supporting member defines an opening therein which overlaps the bending area.

9. The display device of claim 8, wherein along the substrate, the supporting member defining the opening which overlaps the bending area, overlaps the bending area protection layer covering the bending area, by about 100 micrometers to about 200 micrometers.

10. The display device of claim 6, further comprising a driving integrated circuit chip disposed on an end portion of the substrate,
    wherein along the substrate, the bending area protection layer covering the bending area is disposed separated from the driving integrated circuit chip disposed on the end portion of the substrate.

11. The display device of claim 10, further comprising:
    an upper protection layer removably attachable to the encapsulation layer, wherein removal of a portion of the upper protection layer from the encapsulation layer disposes the upper surface of the encapsulation layer exposed to outside the encapsulation layer and forms the nano structure;

a polarization film disposed on the upper surface of the encapsulation layer which is exposed to outside the encapsulation layer; and a window panel disposed on the polarization film.

12. The display device of claim 3, further comprising at the bending area of the substrate, an adhesive supporting layer disposed between the substrate and the bending area protection layer and with which the substrate is attached to the bending area protection layer.

13. The display device of claim 12, wherein the adhesive supporting layer includes at least one among a resin including an acryl material, a butyl rubber, a vinyl acetate resin, an ethylene vinyl acetate resin, a natural rubber, a nitrile, a siliceous resin, a silicon rubber, and a styrene block polymer.

14. The display device of claim 13, wherein adhesiveness of the adhesive supporting layer is higher than adhesiveness of the bending area protection layer.

\* \* \* \* \*